(12) United States Patent
Ogata et al.

(10) Patent No.: US 8,840,752 B2
(45) Date of Patent: Sep. 23, 2014

(54) FLOW PASSAGE SWITCHING APPARATUS, PROCESSING APPARATUS, FLOW PASSAGE SWITCHING METHOD, PROCESSING METHOD AND STORAGE MEDIUM

(75) Inventors: Nobuhiro Ogata, Koshi (JP); Shuichi Nagamine, Koshi (JP); Kenji Kiyota, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 487 days.

(21) Appl. No.: 13/161,275

(22) Filed: Jun. 15, 2011

(65) Prior Publication Data

US 2011/0308626 A1 Dec. 22, 2011

(30) Foreign Application Priority Data

Jun. 22, 2010 (JP) ................................. 2010-141921

(51) Int. Cl.
*F16K 11/22* (2006.01)
*H01L 21/67* (2006.01)

(52) U.S. Cl.
CPC .... *H01L 21/67028* (2013.01); *H01L 21/67173* (2013.01)
USPC ............ 156/345.29; 156/345.31; 156/345.32; 137/2; 137/606; 137/883; 118/718; 118/719

(58) Field of Classification Search
USPC ........ 118/715, 719, 718; 156/345.29, 345.33, 156/345.31, 345.32; 137/625.46, 883, 2, 137/606
See application file for complete search history.

(56) References Cited

U.S. PATENT DOCUMENTS

| | | | | |
|---|---|---|---|---|
| 4,509,456 A | * | 4/1985 | Kleinert et al. | ................ 118/715 |
| 8,256,370 B2 | * | 9/2012 | Kitano et al. | .................... 118/52 |
| 8,298,338 B2 | * | 10/2012 | Kim et al. | ...................... 118/715 |
| 2010/0058841 A1 | * | 3/2010 | Wilen | ........................... 73/61.56 |
| 2011/0308626 A1 | * | 12/2011 | Ogata et al. | ........................ 137/2 |

FOREIGN PATENT DOCUMENTS

| | | |
|---|---|---|
| CN | 2541112 Y | 3/2003 |
| JP | 10-012523 A | 1/1998 |
| JP | 2001-057335 A | 2/2001 |
| JP | 2008-34490 A | 2/2008 |
| JP | 2008-034490 A | 2/2008 |
| JP | 2009-252884 A | 10/2009 |
| JP | 2009252884 A * | 10/2009 |

OTHER PUBLICATIONS

Machine Generated English Translation of JP 2009-252884 held to Kamikawa Yuji. Oct. 29, 2009.*

* cited by examiner

*Primary Examiner* — Sylvia R MacArthur
(74) *Attorney, Agent, or Firm* — Abelman, Frayne & Schwab

(57) ABSTRACT

Disclosed are a flow path switching apparatus and a fluid processing apparatus having a liquid processing unit that performs a processing by supplying different kinds of processing fluid to wafer W at different timings. The atmosphere of the liquid processing unit is discharged fluid to a plurality of exclusive exhaust paths through exhaust paths and flow path switching units. A flow path switching unit includes an outer tube having a plurality of connection holes and a rotary tube inserted into the outer tube having a plurality of openings. In particular, one of the plurality of openings of the rotary tube is aligned with one of the plurality of connection holes of the outer tube in such a way that only an aligned set of an opening of the rotary tube and a connection hole of the outer tube is sequentially communicated during the rotation of the rotary tube.

6 Claims, 16 Drawing Sheets

(a)

(b)

FLOW PASSAGE SWITCHING APPARATUS, PROCESSING APPARATUS, FLOW PASSAGE SWITCHING METHOD, PROCESSING METHOD AND STORAGE MEDIUM

CROSS-REFERENCE TO RELATED APPLICATIONS

This application is based on and claims priority from Japanese Patent Application No. 2010-141921, filed on Jun. 22, 2010, with the Japanese Patent Office, the disclosure of which is incorporated herein in its entirety by reference.

TECHNICAL FIELD

The present disclosure relates to a flow path switching apparatus that switches and connects a plurality of connection flow paths, each allowing an independent fluid to flow to a common flow path connected to the connection flow paths, a flow path switching method, a processing apparatus equipped with the flow path switching apparatus, and a processing method.

BACKGROUND

In a manufacturing process of a semiconductor device, there is a liquid processing that removes particles or pollutants attached to a wafer W by supplying chemical liquid or deionized water onto the surface of a target object, such as a semiconductor wafer ("wafer W"). A liquid processing apparatus is known to perform a liquid processing by supplying a processing liquid onto the surface of a wafer W while rotating wafer W. In the liquid processing apparatus, in order to increase the number of processed wafer W per unit time (throughput), a plurality of liquid processing units (e.g., four to five liquid processing units) that can perform the same kind of liquid processing are provided and wafers W are transferred between the processing units by a common transfer mechanism, such that the liquid processing is simultaneously performed in the plurality of liquid processing units.

The liquid processing unit as shown in FIG. 16 includes a spin chuck 11 that rotates a wafer W having placed thereon, and a cup 12 that surrounds wafer W on spin chuck 11. Acidic or alkaline chemical liquids are used as the processing liquid, and the chemical liquids are switched from a nozzle (not shown) and supplied to wafer W in accordance with the processing.

Japanese Patent Laid-Open Publication No. 2008-34490 (e.g., paragraph [0034], FIGS. 4 and 6), discloses a configuration in which a plurality of liquid processing units are arranged horizontally and an exclusive exhaust line is provided for each of the acidic or alkaline chemical liquid. In this configuration, as shown in FIG. 16, cup 12 of each of liquid processing units is connected with exhaust line 13 of acidic chemical liquid and exhaust line 14 of alkaline chemical liquid, respectively, by exclusive exhaust paths 15 and 16. Valves V15 and V16 are disposed in exhaust paths 15 and 16, respectively, and the atmosphere inside cup 12 is discharged through exclusive exhaust lines 13 and 14 by opening/closing valves V15 and V16 in accordance with the chemical liquid.

However, in this configuration, valves V15 and V16 are required for exclusive exhaust paths 15 and 16, and the number of valves to be equipped is increased as the kind of chemical liquids increases. Further, as the number of valves increases, the number of driving units for the valves increases, such that the control time and the spaces being occupied by the valves or driving units increase.

SUMMARY

An exemplary embodiment of the present disclosure provides a flow path switching apparatus that switches and connects a plurality of connection flow paths, each allowing an independent fluid to flow, to a common flow path connected to the connection flow paths. The switching apparatus includes: an outer tube provided with a plurality of connection holes each formed with a predetermined interval along the longitudinal direction of the circumferential wall of the outer tube and connected to a corresponding connection flow path; a rotary tube, rotatably inserted into the outer tube, provided with a plurality of openings each formed with a predetermined interval at a corresponding position to the connection holes of the outer tube along the longitudinal direction of the circumferential wall of the rotary tube, and connected to the common flow path; and a rotation driving unit configured to rotate the rotary tube. In particular, one of the plurality of openings of the rotary tube is aligned with one of the plurality of connection holes of the outer tube in such a way that only an aligned set of an opening of the rotary tube and a connection hole of the outer tube is sequentially communicated during the rotation of the rotary tube.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
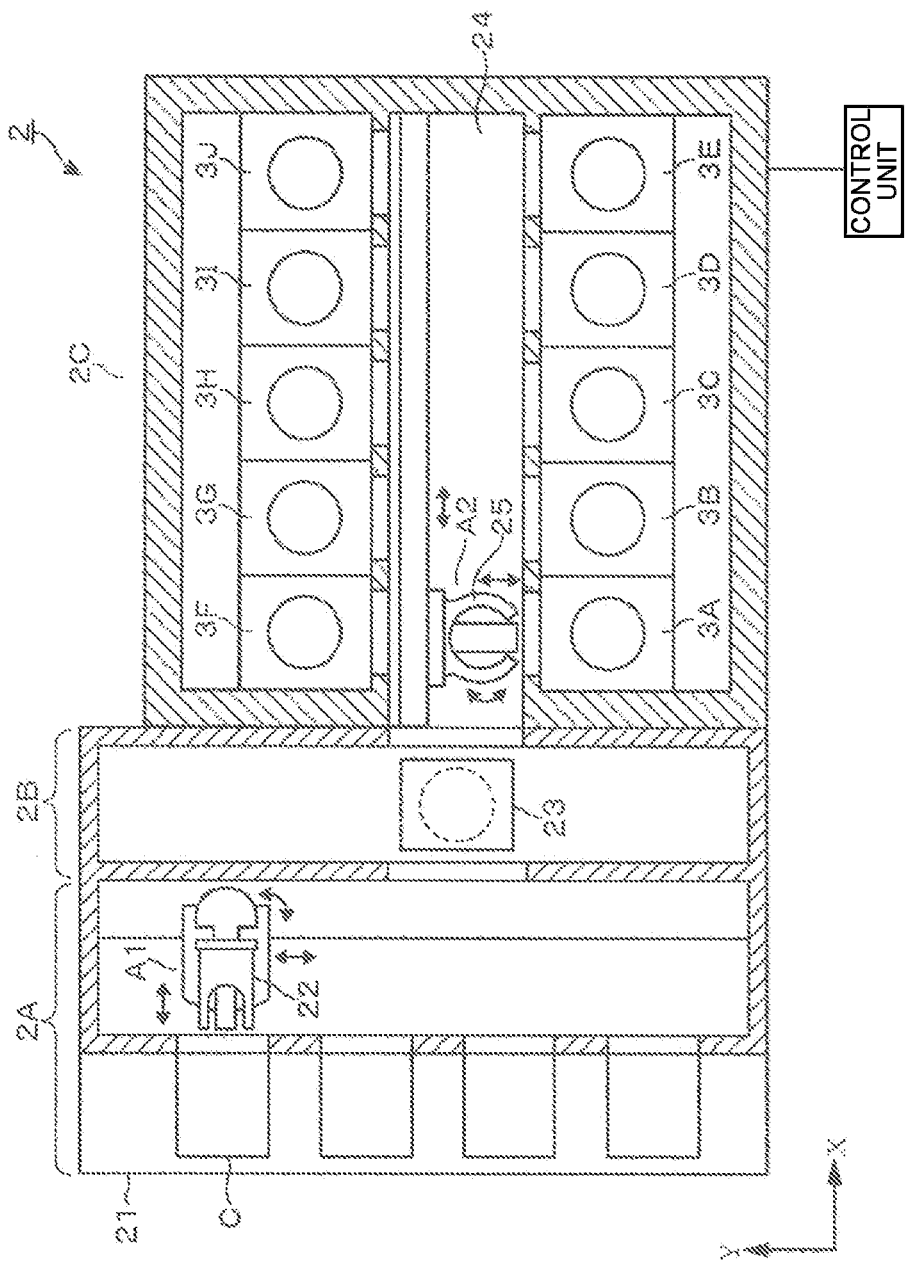
FIG. 1 is a transverse cross-sectional plan view of a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to solve the problems described above, and intends to provide a flow path switching apparatus and a flow path switching method that can reduce the number of driving mechanisms for switching flow paths. Further, the present disclosure provides a processing apparatus and a processing method that can reduce the number of driving mechanism for switching the exclusive exhaust paths of processing fluid capable of processing a target substrate.

In order to achieve the object described above, an exemplary embodiment of the present disclosure provides a flow path switching apparatus that switches and connects a plurality of connection flow paths, each allowing an independent fluid to flow, to a common flow path connected to the connection flow paths. The apparatus includes: an outer tube provided with a plurality of connection holes each formed with a predetermined interval along the longitudinal direction of the circumferential wall of the outer tube and connected to a corresponding connection flow path; a rotary tube, rotatably inserted into the outer tube, provided with a plurality of openings each formed with a predetermined interval at a corresponding position to the connection holes of the outer tube along the longitudinal direction of the circumferential wall of the rotary tube and connected to the common flow path; and a rotation driving unit configured to rotate the rotary tube. In particular, one of the plurality of openings of the rotary tube is aligned with one of the plurality of connection holes of the outer tube in such a way that only an aligned set of an opening of the rotary tube and a connection hole of the outer tube is sequentially communicated during the rotation of the rotary tube. In particular, the plurality of connection holes of the outer tube is formed in a line in the longitudinal direction of the outer tube.

Another exemplary embodiment of the present disclosure provides a processing apparatus including a processing unit that performs a processing while supplying a plurality of different kinds of processing fluids for a target object at different timings; a common flow path provided in the processing unit to discharge the processing fluid supplied to the processing unit; a plurality of exclusive exhaust paths provided for each of the plurality of different kinds of processing fluid to discharge the processing fluid; and a flow path switching apparatus as described above to switch and connect the common flow path to an exclusive exhaust path corresponding to a processing fluid. In particular, the processing apparatus comprises a plurality of processing units, and a plurality of flow path switching apparatuses each corresponding to the common flow path provided in the plurality of processing units. In addition, the processing apparatus further include a plurality of fluid intake openings respectively provided in the plurality of exclusive exhaust paths; a plurality of fluid intake amount control valves respectively provided in the plurality of fluid intake openings and configured to control the opening degree of the fluid intake openings controlling the intake amount of fluid; and a control unit configured to control the opening degree of the fluid intake amount control valves on the basis of the flow rate of the processing fluid flowing through the exclusive exhaust paths. In particular, a plurality of pressure loss control valves are respectively provided in the common flow paths to control the opening degree of the common flow path in order to control a pressure loss in the respective common flow paths.

Yet another exemplary embodiment of the present disclosure provides a flow path switching method using a flow path switching apparatus which includes an outer tube provided with a plurality of connection holes each formed with a predetermined interval along the longitudinal direction of the circumferential wall of the outer tube and connected to a corresponding connection flow path; a rotary tube, rotatably inserted into the outer tube, provided with a plurality of openings each formed with a predetermined interval at a corresponding position to the connection holes of the outer tube along the longitudinal direction of the circumferential wall of the rotary tube and connected to the common flow path; and a rotation driving unit configured to rotate the rotary tube. The method comprising: aligning one of the plurality of openings of the rotary tube with one of the plurality of connection holes of the outer tube in such a way that only an aligned set of an opening of the rotary tube and a connection hole of the outer tube communicates sequentially during the rotation of the rotary tube, thereby switching and connecting the plurality of connection flow paths each allowing an independent fluid to flow to the common flow path connected to the connection flow paths.

Still another exemplary embodiment of the present disclosure provides a processing method including: performing a processing in a processing unit while supplying a plurality of different kinds of processing fluid to a target object at different timings; discharging the plurality of different kinds of processing fluid supplied to the processing unit from a common flow path; and discharging the processing fluid from a corresponding exclusive exhaust path among a plurality of exclusive exhaust paths each provided with the plurality of different kinds of processing fluid and allowing an independent processing fluid to flow. In particular, the common flow path is switched and connected to the exclusive exhaust path by the flow path switching method. In particular, the plurality of common flow paths are connected to the plurality of exclusive exhaust paths, a plurality of fluid intake openings are provided for each of the plurality of exclusive exhaust paths, and the opening degrees of each of the plurality of the fluid intake openings are controlled on the basis of the flow rate of the processing fluid flowing through the plurality of the exclusive exhaust paths.

Still yet another exemplary embodiment of the present disclosure provides a storage medium having stored thereon a computer program used for a processing apparatus that performs a processing in a processing unit while supplying a plurality of different kinds of processing fluid at different timings to a target object. In particular, the computer program includes a group of steps for performing the processing method as described above.

According to a flow path switching apparatus and a flow path switching method of the present disclosure, one of the sets each composed of openings of rotary tube and connection holes of an outer tube correspond respectively to the openings are communicated with each other, and not communicated with other sets by rotating the rotary tube, such that a common flow path is switched and connected to a plurality of connection flow paths. Therefore, it is possible to switch the flow paths only in the rotation driving unit that rotates the rotary tube, such that the number of driving mechanisms for switching the flow path can be reduced. Further, according to the processing apparatus and processing method of the present disclosure, since the processing fluid that processes a target object is switched and communicated with a plurality of exclusive exhaust paths by using the flow path switching apparatus, it is possible to reduce the number of driving mechanism for switching the exclusive exhaust paths.

As an exemplary embodiment according to a processing apparatus of the present disclosure, a description is made, with reference to the accompanying drawings, for a configuration of a liquid processing apparatus 2 that performs a liquid processing for removing particles or pollutants sticking to a wafer W by supplying chemical liquid, which is s processing fluid, on wafer W that is a target object. The liquid processing apparatus 2 of the present disclosure includes a carrier disposing block 2A where a carrier C accommodating a plurality of wafers W is carried in and out to and from the outside, a delivering block 2B having a wafer delivery unit, and a processing block 2C that performs predetermined liquid processing for wafer W. Carrier disposing block 2A, delivering block 2B, and processing block 2C are arranged in a line in the front-rear direction (e.g., X direction in FIG. 1) and are connected with each other, and a position where carrier disposing block 2A is placed is defined as a front side.

Carrier disposing block 2A has a carrier disposing portion 21 where, for example, four carriers C are disposed, and has a carrying in and out arm A1 that delivers a wafer W between a carrier C disposed on carrier disposing portion 21 and delivering block 2B. In carrying arm A1, a holding arm 22 holding the wafer can move, for example, forward and backward direction as well as left and right direction (e.g., Y direction in FIG. 1), and can rotate and move up and down direction.

Delivering block 2B includes a plurality of delivering stages 23 arranged in multistage, and carrying in and out arm A1 and a process arm A2 provided in processing block 2C, which is described below, can access delivering stage 23.

Processing block 2C includes a transportation path 24 for wafer W extending forward/backward, and process arm A2 is disposed on transportation path 24. Further, liquid processing units 3 (3A to 3J) constituting five processing portions are arranged to be opposed with each other at the left and right as seen from carrier disposing block 2A. Process arm A2 delivers wafers W to ten (10) liquid processing units 3 and delivering stages 23 described above. Process arm A2 is configured such that holding arm 25 that holds the circumferential periphery of the back of wafer W can move forward/backward, rotate, move up/down, and move along conveying path 24.

Figure 3:
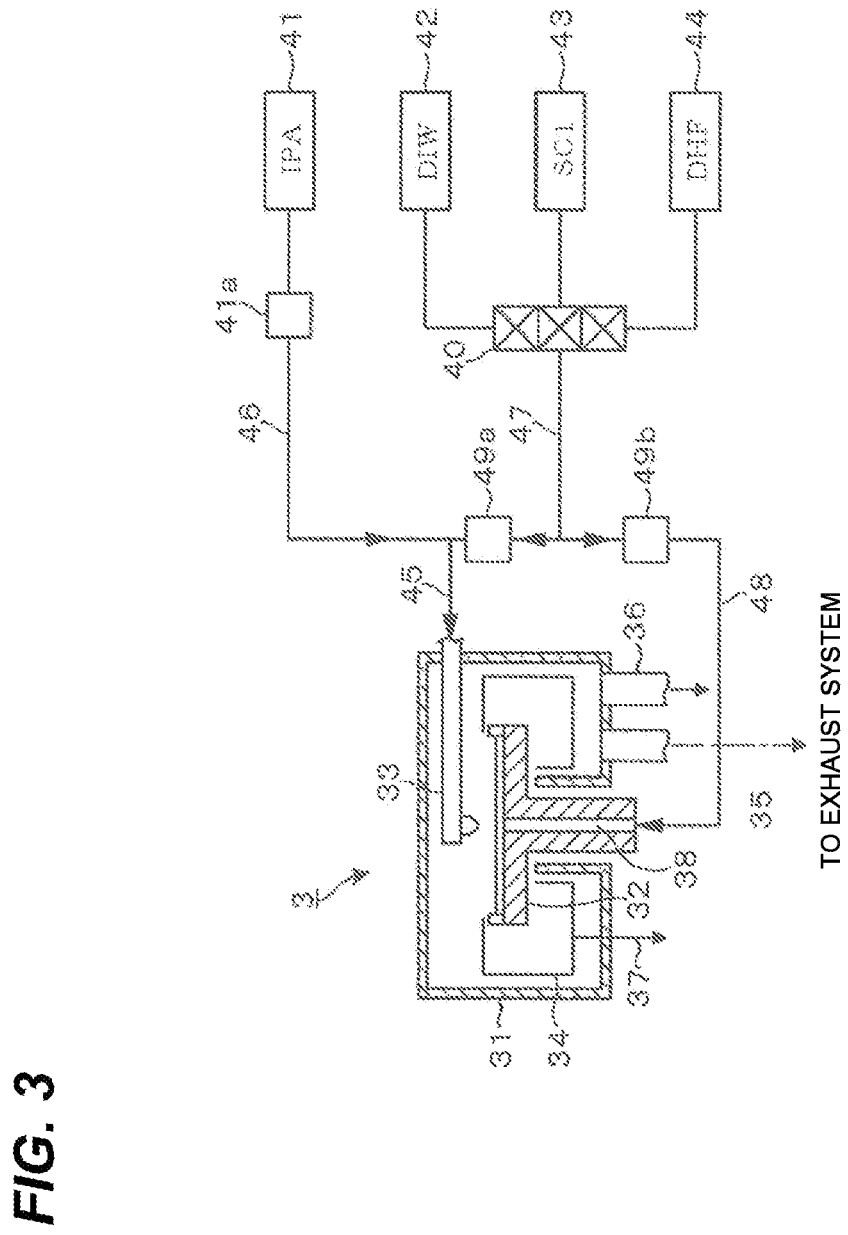
FIG. 3 is a view illustrating the configuration of a liquid processing unit in the liquid processing apparatus.

Next, the configuration of liquid processing unit 3 is described with reference to FIG. 3. Liquid processing unit 3 is a processing unit that processes each sheet of wafers W and includes an outer chamber 31 forming a closed processing space where liquid processing is performed for wafers W, a wafer holding mechanism 32 that rotates wafer W in outer chamber 31 while holding wafer W in a substantially horizontal state, a nozzle arm 33 that supplies chemical liquid to the top surface of wafer W held by wafer holding mechanism 32, and an inner cup 34 that is disposed in outer chamber 31 to surround wafer holding mechanism 32, and receives a chemical liquid dispersed around from wafer W being rotated.

Outer chamber 31 is disposed in a case separated from adjacent another liquid processing unit 3 and wafer W is carried in/out the case by corresponding process arm A2 through a wafer carrying inlet (not shown). An exhaust path 35 is connected to the bottom of outer chamber 31 for discharging the atmosphere inside chamber 32, and an exhaust channel 36 is provided for discharging exhaust water, such as DIW, stored on the bottom of outer chamber 31. Although it is exemplified in the exemplary embodiment that individual exhaust path 35 is connected to the bottom of outer chamber 31, the connection position of individual exhaust path 35 is not limited to the bottom of outer chamber 31, as long as positions at which the atmosphere inside the processing space can be discharged. Inner cup 34 can move up/down between a processing position around wafer holding mechanism 32 and a retreat position in downward of the processing position. Reference numeral '37' in the drawings represents a liquid discharging path provided in inner cup 34. Further, a chemical supply path 38 is formed in wafer holding mechanism 32, and thus chemical liquid may be supplied to the bottom of rotating wafer W through chemical liquid supply path 38.

Nozzle arm 33 has a nozzle for supplying chemical liquid at the front end. The nozzle is connected to an IPA supplying unit 41, a DIW supplying unit 43, an SC1 supplying unit 43, and a DHF supplying unit 44 through supply paths 45, 46, and 47. Further, DIW supplying unit 42, SC1 supplying unit 43, and DHF supplying unit 44 are connected to a supply path 38 of wafer holding mechanism 32 through supply paths 47 and 48.

IPA supply unit 41 supplies IPA (isopropyl alcohol) for drying wafer W by using high volatility, and DIW supplying unit 42 supplies DIW liquid (deionized water) that rinses liquid for removing chemical liquid remaining on wafer W after processing with the chemical liquid. Further, SC1 supplying unit 43 supplies SC1 liquid (liquid mixture of ammonia and hydrogen peroxide) that is chemical liquid for removing particles or organic pollutants on the surface of wafer W, and DHF supplying unit 44 supplies DHF liquid (diluted hydrofluoric acidic liquid) for removing a natural oxide film on the surface of wafer W. Reference numeral 41a in the drawings represents a mass flow control unit, reference numeral 40 represents a switching valve, and reference numerals 49a and 49b represent mass flow control units that controls the amount of chemical liquid supplied to nozzle arm 33 and wafer holding mechanism 32. In this configuration, the IPA, DHF liquid, and SC1 liquid correspond to organic chemical liquid, acidic chemical liquid, and alkaline chemical liquid, respectively.

Figure 2:
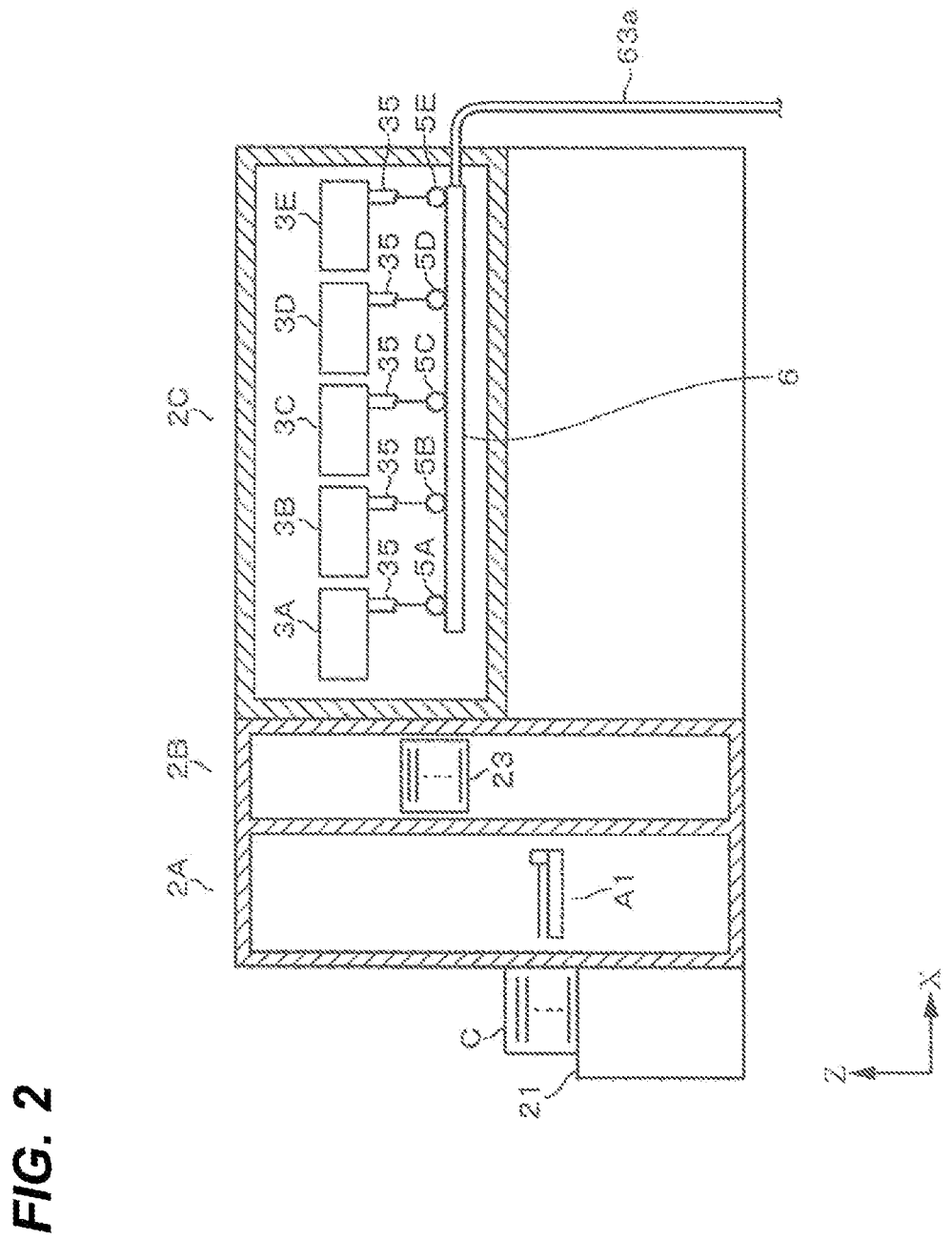
FIG. 2 is a schematic longitudinal cross-sectional side view of the liquid processing apparatus according to an exemplary embodiment of the present disclosure.
Figure 4:
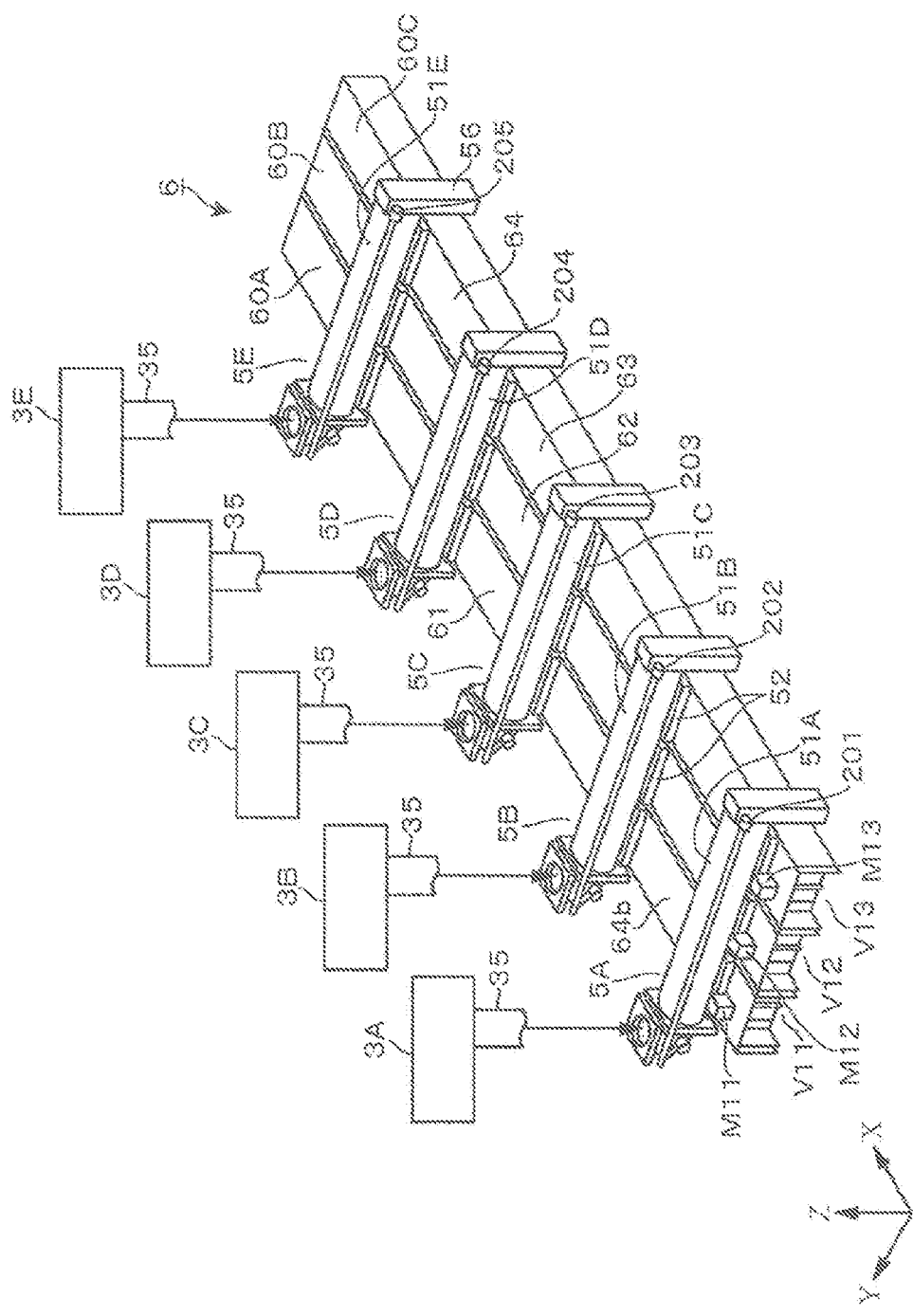
FIG. 4 is a perspective view illustrating a flow path switching apparatus in the liquid processing unit.

Continuously, the exhaust system of liquid processing unit 3 is described. Although five liquid processing units 3 are arranged at both sides of transportation path 24 in the exemplary embodiment, exhaust paths 35 of five liquid processing units 3 arranged at one side of conveying path 24, as shown in FIGS. 2 and 4, are connected to a flow path forming member 6 through flow path switching units 5, 5A to 5E constituting the flow path switching apparatus of the present disclosure. Therefore, in the exemplary embodiment, five liquid processing units 3A to 3E arranged at the right side of conveying path 24 when seen from carrier disposing block A1 are connected to common flow path forming member 6 through flow path switching units 5, 5A to 5E, and five liquid processing units 3F to 3J arranged at the left side of conveying path 24 when seen from carrier disposing block A1 are connected to a common flow path forming member (not shown). Exhaust path 35 of liquid processing unit 3 correspond to a common flow path for discharging processing fluid. Hereinafter, descriptions are made for the exhaust systems of five liquid processing units 3A to 3E arranged at the right side of conveying path 24 when seen from carrier disposing block A1.

Figure 5:
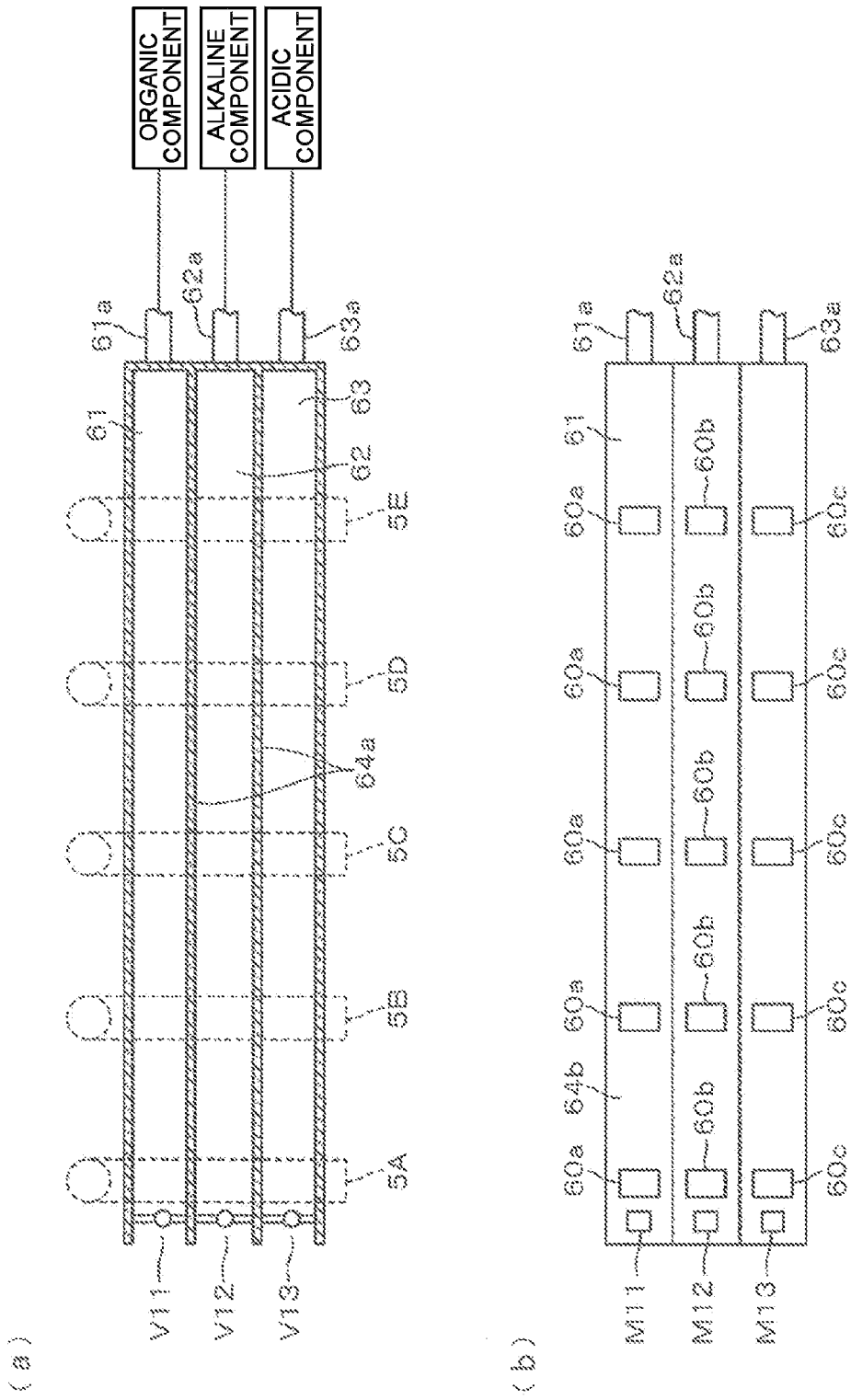
FIG. 5 is a plan view illustrating an exclusive exhaust path in the liquid processing unit.

Flow path forming members 6, as shown in FIGS. 4 and 5, extend in parallel with each other and form a plurality of exclusive exhaust paths (connection flow path) that allow air flow including a plurality of different kinds of processing fluid to individually flow. In the exemplary embodiment, flow path forming members 6 have a first flow path 61, a second flow path 62, and a third flow path 63 to individually discharge the air flow including three kinds of processing fluid and the periphery of first to third flow paths 61 to 63 are covered by a wall 64. For example, flow path forming members 6 are formed by arranging three pipes 60 (60A to 60C) horizontally in parallel with one another. However, in FIG. 5A, for the convenience of illustration, a wall 64a separating adjacent flow paths 61 to 63 pertains to one of pipes 60 is shown while the gap between pipes 60 are not shown in FIG. 5B.

In first to third flow paths 61 to 63, for example, each of first flow path 61, second flow path 62, and third flow path 63 is designated for exclusive exhaust paths for air flow including organic chemical liquid, air flow including alkaline chemical liquid, and air flow including acidic chemical liquid, respectively. Exclusive exhaust lines 61a to 63a are connected to first to third flow paths 61 to 63, respectively, at one end of flow path forming member 6 and are connected to exhaust gas removal equipment through exhaust lines of factory power usage. Therefore, negative pressure is set in each of flow paths 61 to 63 of flow path forming member 6 by exclusive exhaust lines 61a to 63a. Further, the atmosphere inside each of liquid processing units 3A to 3E is discharged through exhaust paths 35 and then discharged to each of exclusive exhaust lines 61a to 63a through flow paths 61 to 63 switched and connected correspondingly with the kinds of processing fluid by flow path switching unit 5, which is described below.

Figure 6:
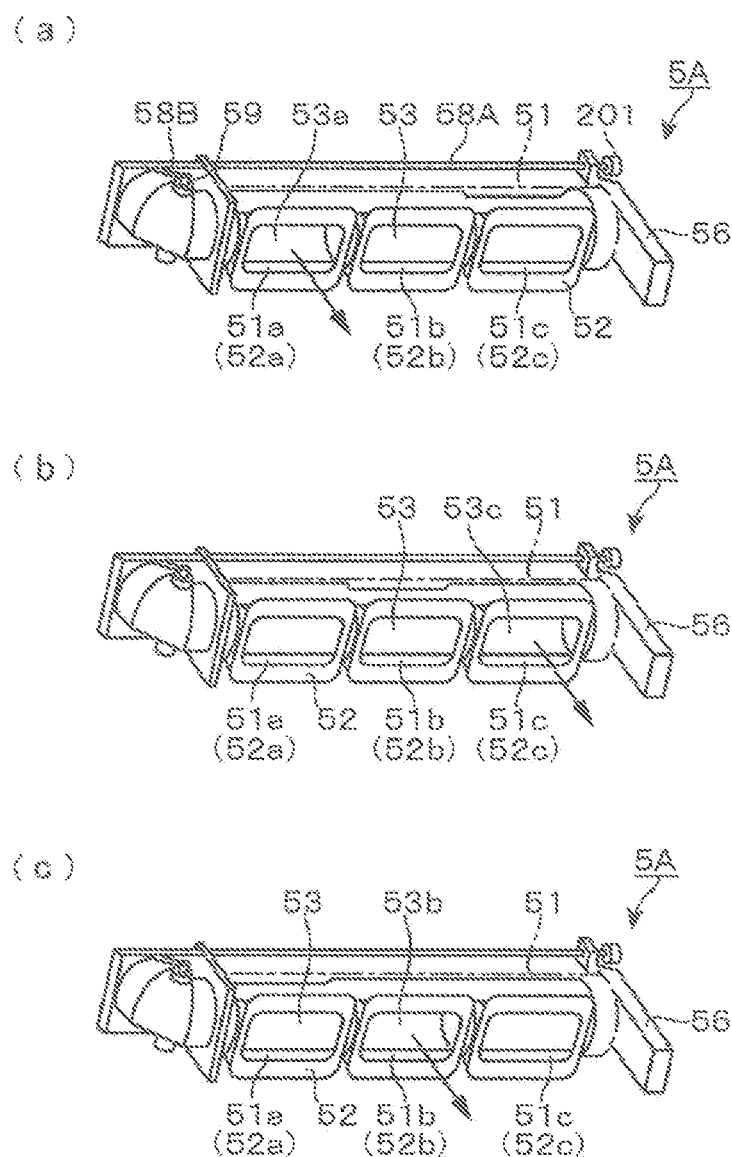
FIG. 6 is a perspective view illustrating the flow path switching apparatus.
Figure 7:
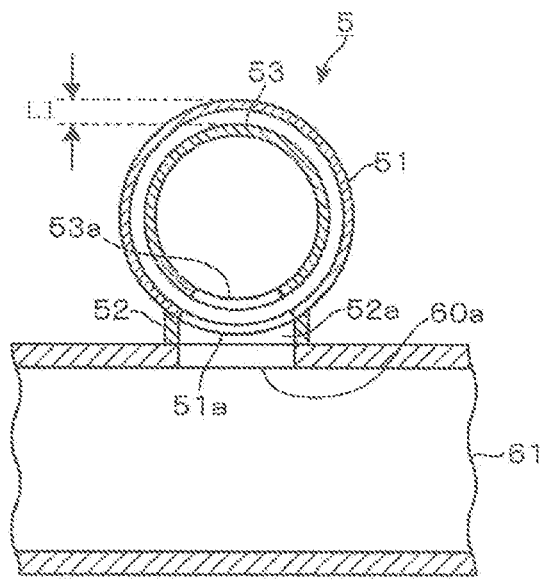
FIG. 7 is a cross-sectional view and a developed view illustrating an outer tube and a rotary tube of the flow path switching apparatus.
Figure 7:
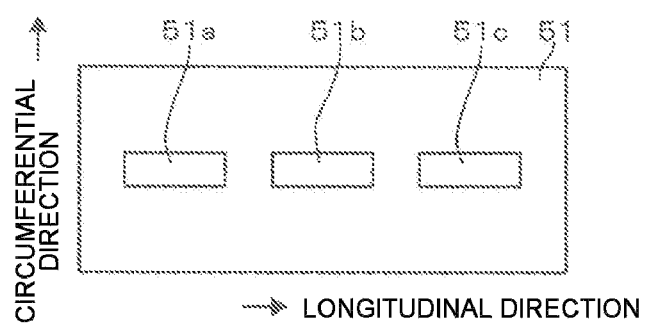
Figure 7:
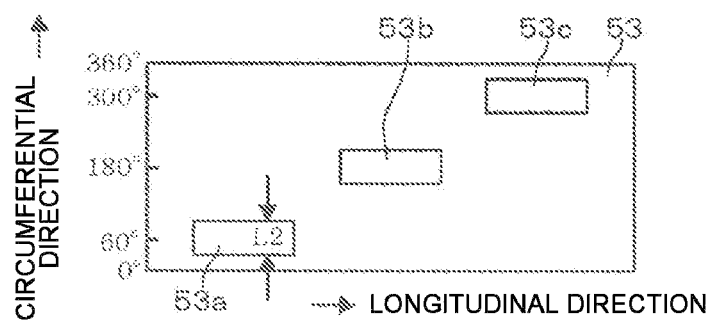

Further, in wall 64, for example, upper wall 64b, of flow path forming member 6, outer tubes 51 (51A to 51E) are provided for each of liquid processing units 3A to 3E to be perpendicular to the longitudinal direction of flow path forming members 6 (e.g., X direction in FIG. 4) and cover all flow paths 61 to 63 in the perpendicular direction. In the exemplary embodiment, outer tubes 51, as shown in FIGS. 4, 6, and 7, for example, are formed in cylinders and attached to flow path forming members 6 by a support member 52. FIG. 6 is a schematic perspective view of outer tubes 51 and support member 52, seen from the bottom (flow path forming members 6), in which outer tubes 51 are indicated by dashed dotted lines.

First to third openings 60a to 60c that open to each of first to third flow paths 61 to 63 are formed at the regions where outer tubes 51 are disposed in flow path forming members 6, as shown in FIGS. 5 and 7. Meanwhile, first to third connection holes 51a to 51c that open to each of first to third flow paths 6163 are formed at predetermined intervals along the longitudinal direction of the circumferential wall of outer tubes 51. Further, in support member 52, first to third connection holes 52a to 52c that open to each of first to third flow paths 61 to 63 are also formed. Therefore, three flow paths 61 to 63 of flow path forming members 6 and outer tubes 51 are communicated with each other through openings 60a to 60c and connection holes 51a to 51c and 52a to 52c. In this configuration, openings 60a to 60c of flow path forming members 6 are formed with a size to be covered by outer tubes 51.

Figure 8:
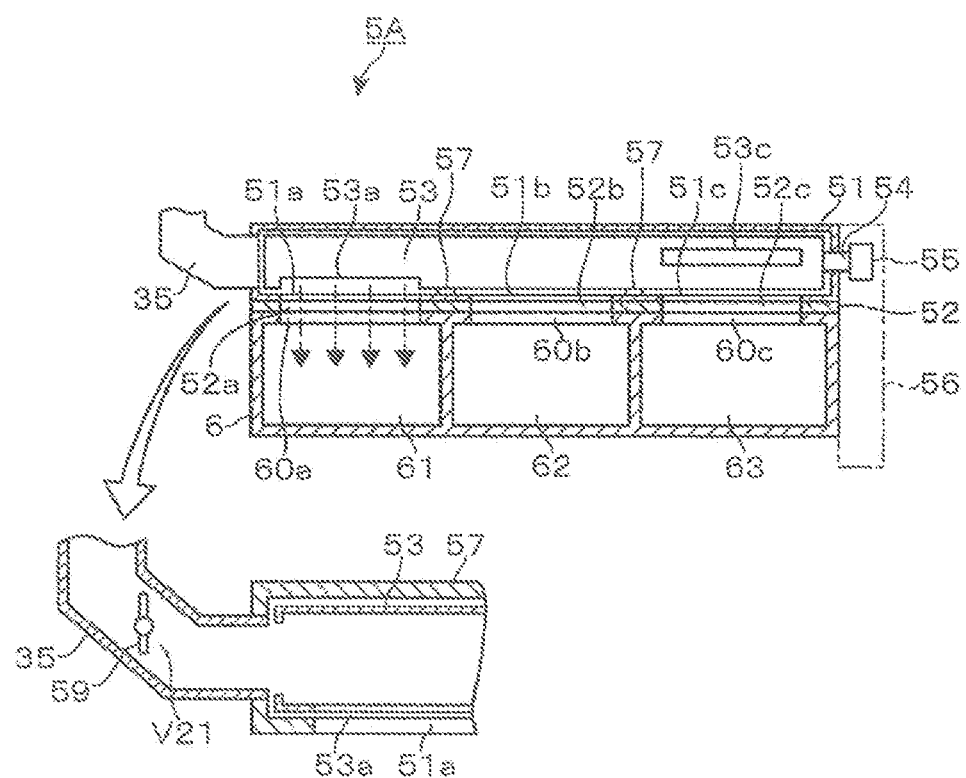
FIG. 8 is a side cross-sectional view illustrating the flow path switching apparatus.

A cylindrical rotary tube 53 that is rotatably inserted in outer tube 51 is disposed in outer tube 51, as shown in FIGS. 6 to 8. One end of rotary tube 53 is connected to a rotation driving unit 55 disposed outside one end of outer tube 51, through a substantially horizontal rotary shaft 54. Rotation driving unit 55, for example, is constituted by a rotary cylinder and rotary tube 53 can rotate around the substantially horizontal shaft, in outer tube 51.

Meanwhile, exhaust path 35 of liquid processing unit 3 is connected to the other end of outer tube 51 and the other end of rotary tube 53 is open at positions close to the other end of outer tube 51. Accordingly, the other end of rotary tube 53 is constituted as a connection hole connected to exhaust path 35 and the air flow discharged from exhaust path 35 flows inside rotary tube 53. Reference numeral 56 in the drawings represents a receiving unit that accommodates rotary driving unit 55.

Reference numeral 57 in the drawings represents a protrusion, for example, which has a ring shape partially formed outside rotary tube 53 and a predetermined gap is formed between protrusion 57 and outer tube 51. Outer tube 51, rotary tube 53, and protrusion 57 may be made of, for example, materials such as polyvinyl chloride (PVC), polypropylene (PP), or polytetrafluoroethylene (PTFE). In this configuration, rotary tube 53 is pivotally supported at one end, such that it may be longitudinally slightly inclined, but in this case, protrusion 57 comes in contact with the inner side of outer tube 51 and supports rotary tube 53. Even in this state, protrusion 57 is formed partially and narrowly and rotary tube 53 is light, such that rotation of rotary tube 53 is not interrupted.

Further, as shown in FIGS. 6 and 7, a plurality of openings 53a to 53c are formed with intervals along the longitudinal direction of rotary tube 53, at the positions corresponding to connection holes 51a to 51c of outer tube 51, at the circumferential wall of outer tube 53. FIG. 7B is a developed view of outer tube 51, and FIG. 7C is a developed view of rotary tube 53. However, in the exemplary embodiment, as shown in FIGS. 7B and 7C, first to third connection holes 51a to 51c of outer tube 51 are arranged in a line along the longitudinal direction of outer tube 51. Meanwhile, each of first to third openings 53a to 53c of rotary tube 53 is formed to correspond to each of three connection holes 51a to 51c of outer tube 51, at different positions in the circumferential direction of rotary tube 53. At this time, openings 53a to 53c are spaced from each other by 120° such that the respective central position in circumferential direction of openings 53a to 53c become the positions dividing outer tube 53 into three equal parts in the circumferential direction.

Further, first opening 53a corresponding to first connection hole 51a of outer tube 51 is formed at the other end (at exhaust path 35) of rotary tube 53, third opening 53c corresponding to third connection hole 51c of outer tube 51 is formed at one end (at rotation driving unit 55) of rotary tube 53, and second opening 53b corresponding to second connection hole 51b of outer tube 51 is formed at the center of rotary tube 53.

Therefore, as rotary tube 53 is rotated, first connection hole 51a faces first opening 53a at a given position, second connection hole 51b faces second opening 53b at some position, and third connection hole 51c faces third opening 53c at some other position.

Accordingly, first to third openings 53a to 53c of rotary tube 53 are arranged such that, while rotary tube 53 rotates, one of the sets composed of first to third connection holes 51a to 51c of outer tube 51 and first to third openings 53a to 53c of rotary tube 53, which correspond to each other, is arranged to be connected, and other sets are not connected. In addition, the state where the connection holes and the corresponding openings of the sets are communicated or not communicated with each other is occurred sequentially among the respective sets. That is, one of the plurality of openings of the rotary tube is aligned with one of the plurality of connection holes of the outer tube in such a way that only an aligned set of an opening of the rotary tube and a connection hole of the outer tube is sequentially communicated during the rotation of the rotary tube.

In this configuration, first to third openings 60a to 60c of flow path forming member 6 are arranged to correspond to first to third connection holes 51a to 51c of outer tube 51, and first to third openings 60a to 60c are covered by outer tube 51. Therefore, when one of the sets, each composed of first to third connection holes 51a to 51c of outer tube 51 and first to third openings 53a to 53c of rotary tube 53 corresponding respectively to the first to third connection holes, is aligned and communicated, openings 60a to 60c of flow path forming member 6 corresponding to the set are open, and for the other sets that are not communicated, openings 60a to 60c of flow path forming member 6 which correspond to the other sets are closed. Accordingly, exhaust path 35 of liquid processing unit 3 is switched and connected to flow paths 61 to 63 corresponding to the kinds of processing fluid, by flow path switching unit 5.

In the exemplary embodiment, rotation driving unit 55 is stopped at predetermined three positions on the basis of commands from control unit 100, which is described above. For example, first opening 53a faces first connection hole 51a at a first position, second opening 53b faces second connection hole 51b at a second position, and third opening 53c faces third connection hole 51c at a third position.

Figure 9:
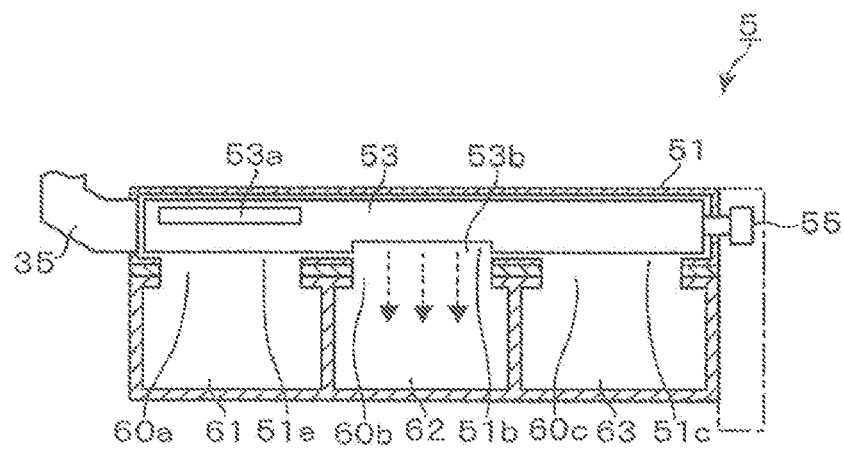
FIG. 9 is a side cross-sectional view illustrating the flow path switching apparatus.
Figure 9:
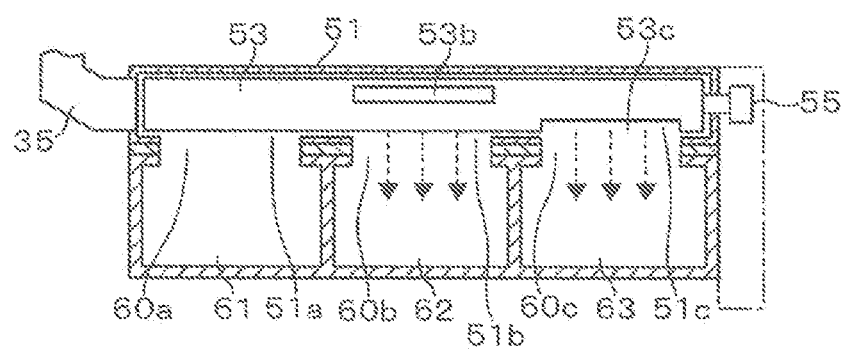

Further, at the first position, as shown in FIG. 8, first connection hole 51a is open while second and third connection holes 51b and 51c are closed, and an exhaust component including the organic chemical liquid from liquid processing unit 3 is discharged to first flow path 61. Further, at the second position, as shown in FIG. 9A, second connection hole 51b is open while first and third connection holes 51a and 51c are closed, and an exhaust component including the alkaline chemical liquid from liquid processing unit 3 is discharged to second flow path 62. Further, at the third position, as shown in FIG. 9B, third connection hole 51c is open while first and second connection holes 51a and 51b are closed, and an exhaust component including the acidic chemical liquid from liquid processing unit 3 is discharged to third flow path 63.

Therefore, flow path switching unit 5 is composed of outer tube 51, rotary tube 53, and rotation driving unit 55. In the exemplary embodiment, for example, the center position is assumed to be a position when rotary tube 53 is at the third position (where the exhaust component of acidic chemical liquid is discharged). And, thereafter, rotary tube 53 is positioned at the first position by being rotated clockwise from the third position, and is positioned at the second position by being rotated counterclockwise from the third position counterclockwise, when seen from rotation driving unit 55.

Here, the term "communicated" indicates a case where an open area is formed between first to third connection holes 51a to 51c of outer tube 51 and first to third openings 53a to 53c of rotary tube 53 corresponding respectively to the first to third connection holes. To this regard, the open area may be an area where one of the connection holes of outer tube 51 faces one of the openings of rotary tube 53 completely. Alternatively, the open area may be an area where one of the connection holes of outer tube 51 partially faces one of the openings of rotary tube 53.

In this configuration, as an example of the dimensions of outer tube 51 and rotary tube 53, for example, the length and the inner diameter outer tube 51 are set to 520 mm and ϕ100 mm, respectively. Further, for example, the length and the inner diameter of rotary tube 53 are set to 512 mm and ϕ83 mm while the width of a gap L1 between outer tube 51 and rotary tube 53 is set to 0.5 mm, for example. Further, a circumferential length L2 of openings 53a to 53c (see, e.g. FIG. 7B) is set to 70 mm, for example.

Further, the other ends of first to third flow paths 61 to 63 in flow path forming member 6 are open and injection amount adjusting valves V11 to V13 are disposed at the other ends of first to third flow paths 61 to 63. Injection amount adjusting valves V11 to V13 are constituted, for example, by butterfly valves, and the opening degrees thereof are controlled by motors M11 to M13 constituting a driving unit disposed at an upper wall 64b of flow path forming member 6 for example, on the basis of commands from control unit 100.

Injection amount adjusting valves V11 to V13 are provided to discharge a predetermined amount of air flow through flow paths 61 to 63, regardless of an amount of exhaust from exhaust path 35 of liquid processing unit 3. Accordingly, the opening degrees of first to third flow paths 61 to 63 are determined, respectively, in accordance with the open state and closed state of first to third openings 60a to 60c of flow path forming member 6 by flow path switching units 5A to 5E. That is, injection amount adjusting valves V11 to V13 are opened at predetermined opening degrees for the respective first to third flow paths 61 to 63, on the basis of the open/closed number of first to third openings 60a to 60c and a predetermined amount of air is introduced into flow paths 61 to 63. Accordingly, in flow paths 61 to 63, the total amount of exhaust is controlled to be a predetermined amount by mixture of the exhaust air from liquid processing unit 3 and the air.

Figure 10:
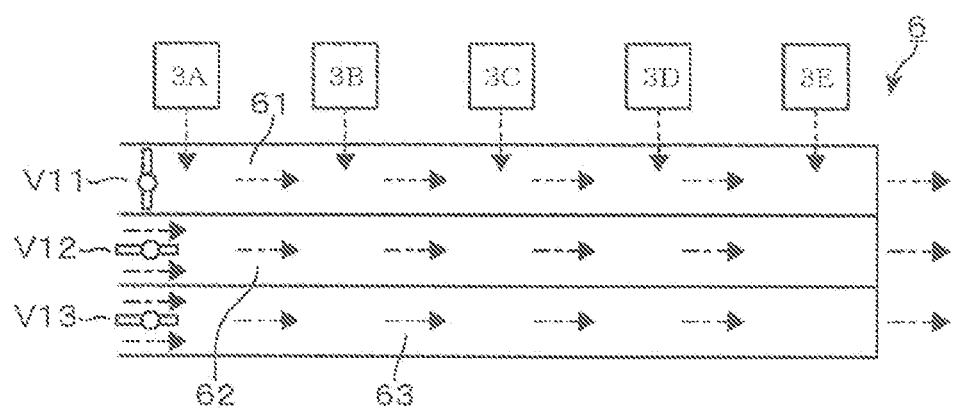
FIG. 10 is a plan view illustrating the exclusive exhaust path.
Figure 10:
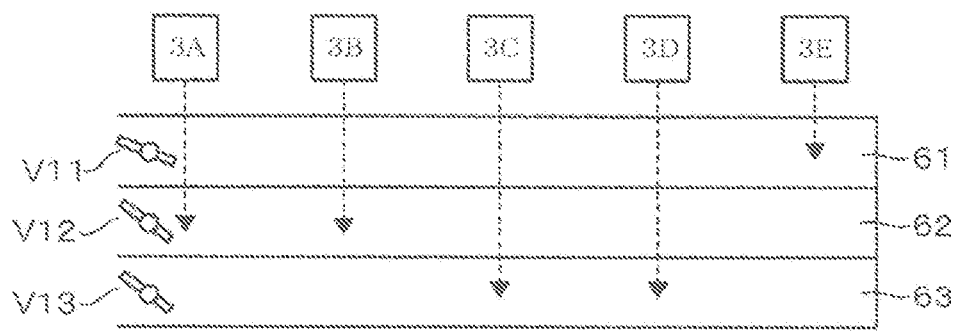

Specifically, referring to FIG. 10, for example, when flow switching units 5A to 5E of all of liquid processing units 3A to 3E are controlled to open first opening 60a and close second and third openings 60b and 60c, injection amount adjusting valve V11 is closed and injection amount adjusting valves V12 and V13 are open at the first open degree while air is sucked through second and third flow paths 62 and 63.

Further, for example, first flow path 61 is set to be open at the first opening degree when all of openings 60a are closed, at the second opening degree when one of openings 60a is open, at the third opening degree when two of openings 60a are open, at the fourth opening degree when three of openings 60a are open, and at the fifth open degree when four of openings 60a are open. At this time, in the opening degree of injection amount adjusting valve V11 is controlled such that first opening degree is larger than second opening degree, which is larger than third opening degree, which is larger than fourth opening degree, which is larger than fifth opening degree (i.e., first opening degree>second opening degree>third opening degree>fourth opening degree>fifth opening degree). The control of opening degree is performed by motor M11 on the basis of commands from control unit 100.

Therefore, in first to third flow paths 61 to 63 of flow path forming member 6, as shown in FIG. 10B, the opening degrees of injection amount adjusting valves V11 to V13 are controlled for each of flow paths 61 to 63 on the basis of the exhaust amount from liquid processing unit 3 and a predetermined amount of air is sucked. In the exemplary embodiment, since only opening 60a corresponding to one liquid processing unit 3E is open, for first flow path 61, injection amount adjusting valve V11 is controlled to be opened at the second opening degree, and since openings 60b and 60c corresponding to two liquid processing units 3A and 3B, 3C and 3D are open, for second and third flow paths 62 and 63, injection amount adjusting valves V12 and V13 are controlled to be opened at the third opening degree. In the exemplary embodiment, the openings of the ends of connection flow paths 61 to 63 of flow path forming member 6 correspond to flow intake openings.

Further, it may be possible to detect the exhaust amount for each of flow paths 61 to 63 at the outlets thereof, for example, around the connection parts with exclusive exhaust lines 61a to 63a, by using flow rate sensors, and control the intake amount of air by controlling the opening degrees of injection amount adjusting valves V11 to V13, on the basis of the detected values, such that the total exhaust amount becomes a predetermined amount.

Figure 11:
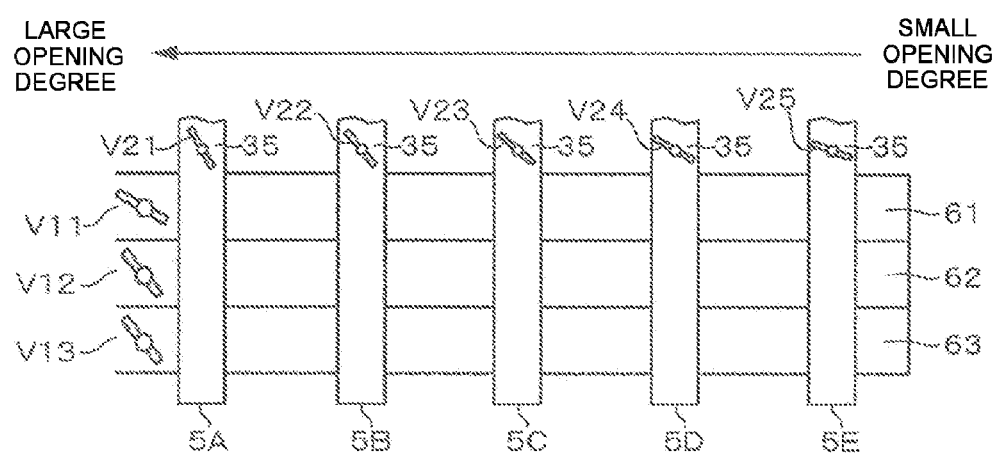
FIG. 11 is a plan view illustrating the operation of a pressure loss control valve in the common flow path.

Further, pressure loss control valves V2 (V21 to V25) are provided, as shown in FIG. 11, around the upstream of flow path switching units 5 inside exhaust paths 35 of liquid processing units 3A to 3E. Pressure loss control valves V21 to V25 are implemented, for example, by butterfly valves and the opening degrees thereof are controlled by driving mechanisms. In the exemplary embodiment, as shown in FIGS. 4 and 6, driving mechanisms 201 to 205 are provided around receiving unit 56 of rotation driving unit 55 of rotary tube 53 and drive power is transmitted to a rotary shaft 59 of pressure loss control valves V21 to V25 through two driving shafts 58A and 58B.

Pressure loss control valves V21 to V25 are provided to control pressure loss in exhaust paths 35 from five liquid processing units 3A to 3E to be maintained at the same level. That is because pressure loss is smaller and the exhaust amount is larger in exhaust paths 35 of liquid processing unit 3E close to the exhaust line of power usage of a factory than exhaust paths 35 of liquid processing unit 3A farther from the exhaust line. Therefore, the opening degrees of pressure loss control valves V21 to V25 are controlled in accordance with the positions from the exhaust line. And the opening degrees are set in such a way that the farther exhaust paths 35 from the exhaust line, the larger the opening degree. For example, the relationship between the opening degrees is set as follows: pressure loss control valve V21 of liquid processing unit 3A>pressure loss control valve V22 of liquid processing unit 3B>pressure loss control valve V23 of liquid processing unit 3C>pressure loss control valve V24 of liquid processing unit 3D>pressure loss control valve V25 of liquid processing unit 3E.

Further, liquid processing apparatus is equipped with control unit 100. Control unit 100 is constituted, for example, by a computer having a CPU and a storage unit. A program may be stored in each recipe in the storage unit including a group of steps (commands) for control of the operation of liquid processing apparatus 2, for example, the operation until a liquid-processed wafer W is received in carrier C after wafer W is carried in and subjected to a liquid processing in liquid processing unit 3. The program may be stored in a storing medium, such as a hard disc, a compact disc, photo-magnetic disc, and a memory card, and the program may be installed in the computer by the storing medium.

Figure 12:
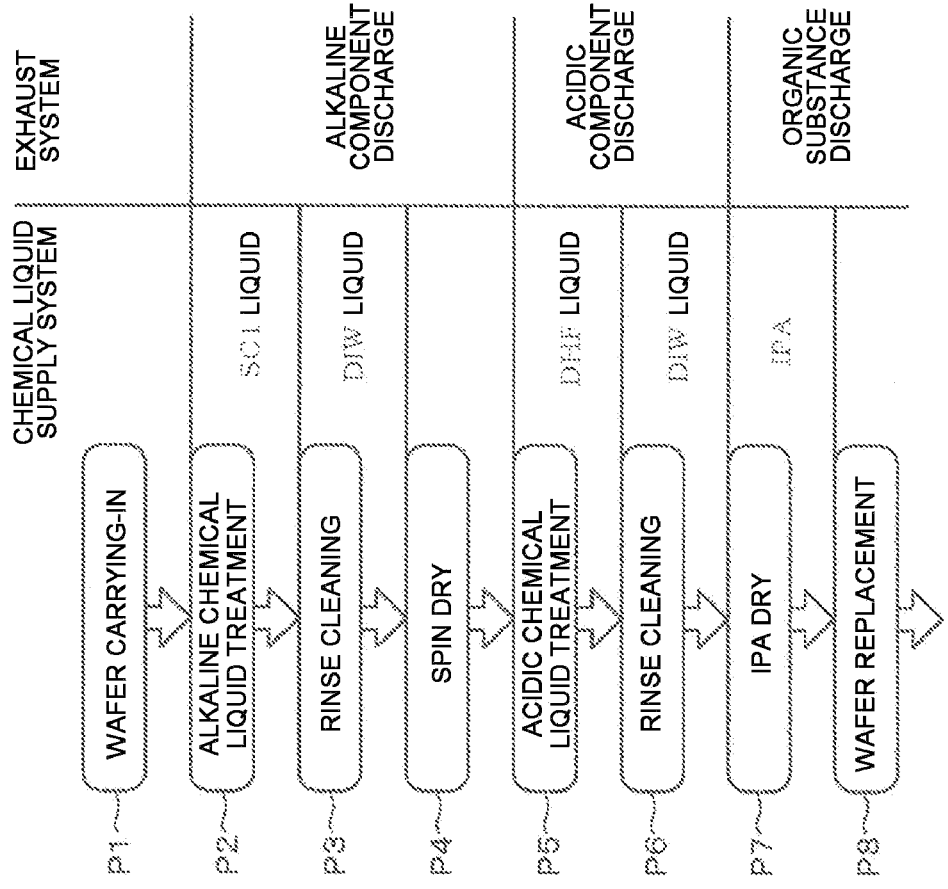
FIG. 12 is a view illustrating a liquid processing that is performed in the liquid processing unit.

Further, control unit 100 switches the chemical liquid supply system or exhaust system to a switching unit shown in FIG. 12, in accordance with the kinds of processing that is performed in liquid processing unit 3. In liquid processing unit 3, the operations of carrying in a wafer (P1)→alkaline chemical liquid processing (P2)→rinse cleaning (P3)→spin drying (P4)→acidic chemical liquid processing (P5)→rinse cleaning (P6)→IPA drying (P7)→wafer replacement (P8) are repeatedly performed, and the chemical liquid supply system or exhaust system is switched by the operations.

That is, the chemical liquid supply system is switched in such a way that SC1 liquid, DIW liquid, and DHF liquid are supplied to both the top and bottom surfaces of wafer W during alkaline chemical liquid processing (P2), during rinse cleaning (P3) and (P6), and in acidic chemical liquid processing (P5), respectively, and also IPA is supplied to the top surface of wafer W during IPA dry (P7).

Further, for the exhaust system, flow path switching unit 5 is controlled in such a way that exhaust units thereof are respectively switched to second flow path 62 of flow path forming member 6 during alkaline chemical liquid processing (P2) to spin dry (P4), third flow path 63 of flow forming member 6 during acidic chemical liquid processing (P5) and rinse cleaning (P6), and first flow path 61 of flow forming member 6 during IPA dry (P7) and wafer replacement (P8). At this time, the opening degrees of injection amount adjusting valves V11 to V13 are controlled in accordance with the switching of flow path switching unit 5. The timing of switching to the chemical liquid supply system or exhaust system is stored in advance in a storage of control unit 100, as a processing recipe of chemical liquid processing in liquid processing apparatus.

Next, the operation of liquid processing apparatus 2 of the present disclosure is described. Wafer W in carrier C carried in carrier disposing block 2A from the outside is delivered to delivering stage 23 of delivery block 2B by carrying arm A1. Further, in processing block 2C, process arm A2 takes wafer W from delivering stage 23, enters one of liquid processing units 3, and delivers wafer W to wafer holding mechanism 32.

An example of liquid processing that is performed in liquid processing units 3 is described. In the liquid processing, when wafer W is disposed in wafer holding mechanism 32 that is not shown, nozzle arm 33 is moved to upward position of the center portion of wafer W and inner cup 34 is lifted to the processing position. Further, in flow path switching unit 5, rotary tube 53 is being set at the second position and while rotating wafer W by wafer holding mechanism 32, SC1 liquid is supplied to both top and bottom of wafer W by the nozzle and chemical liquid supply path 38 of wafer holding mechanism 32. Accordingly, a liquid film of the chemical liquid is formed on wafer W and alkaline chemical liquid cleaning is performed.

In this operation, the alkaline chemical liquid is dispersed by the rotation of wafer W in outer chamber 31 and the atmosphere inside chamber 31 includes mists of the alkaline chemical liquid. Therefore, the atmosphere inside outer chamber 31 is discharged through exhaust path 35, air flow including the mists of the alkaline chemical liquid is discharged from exhaust path 35 through flow path switching unit 5 and second flow path 62 of flow path forming member 6. When the alkaline chemical liquid cleaning is finished, inner cup 34 is moved to the retreat position and DIW liquid is supplied to the nozzle and chemical liquid supply path 38 of wafer holding mechanism, such that rinse cleaning for removing SC1 liquid on the surface of wafer W is performed. Spin dry is performed after rinse cleaning is finished.

Thereafter, inner cup 34 is lifted again to the processing position, wafer W is rotated, rotary tube 53 is switched to the third position in flow path switching unit 5, and DHF liquid is supplied to the top and bottom surfaces of wafer W by the nozzle and chemical liquid supply path 38 of wafer holding mechanism 32. Accordingly, a liquid film of the DHF liquid is formed on the top and bottom surfaces, acidic chemical liquid cleaning is performed, and air flow including the mists of acidic chemical liquid is discharged from liquid processing unit 3 through exhaust path 35 and third flow path 63 of flow path forming member 6. Further, after a predetermined time has elapsed, inner cup 32 is moved down to the retreat position and the chemical liquid supply system is switched for the DIW liquid, and then rinse cleaning is performed again.

Continuously, inner cup 34 is lifted to the processing position, wafer W is rotated, rotary tube 53 is switched to the first position in flow path switching unit 5, and IPA is supplied to the top of wafer W. As described above, IPA dry using volatility of the IPA is performed, and accordingly, DIW liquid remaining on the surface of wafer W after rinse cleaning is completely removed. In this operation, air flow including the mists of organic chemical liquid is discharged from liquid processing unit 3 through exhaust path 35 and first flow path 61 of flow path forming member 6. Thereafter, inner cup 34 is moved to the retreat position, an carry in and out port (not shown) is opened, process arm A2 is entered into liquid processing unit 3 to take out and transfer wafer W that has been processed to delivering stage 23.

Here, in the liquid processing apparatus, wafers W are sequentially transferred to ten (10) liquid processing units 3 by process arm A2 and a predetermined liquid processing is performed. Further, as described above, the atmosphere inside five liquid processing units 3A to 3E arranged at the right side of transportation path 24 when seen from carrier disposing block 2A is discharged through exhaust path 35 and flow path switching units 5A to 5E to common flow path forming member 6. Similarly, the atmosphere inside five liquid processing units 3F to 3J arranged at the left side of transportation path 24 when seen from carrier disposing block 2A is discharged through exhaust path 35 and flow path switching units 5 to common flow path forming member 6.

In this operation, for each of liquid processing units 3A to 3J, the position of rotary tube 53 in flow path switching unit 5 is selected based on the command from control unit 100, and first to third flow paths 61 to 63 are switched in accordance with the kinds of chemical liquid, thereby being exhausted exclusive exhaust paths 61a to 63a. Therefore, when seen from flow path forming member 6, each of openings 60a to 60c is opened/closed for each of first to third flow paths 61 to 63.

Further, as described above, in valves V11 to V13, the opening degrees are controlled in accordance with the number of openings 60a to 60c opened, for each of flow paths 61 to 63, on the basis of commands from control unit 100. Accordingly, in flow paths 61 to 63 of flow path forming member 6, as described above, the total exhaust amount becomes the same by the mixture of the air and the exhaust air from liquid processing unit 3, regardless of open and closed states of openings 60a to 60c.

According to the exemplary embodiment, flow path unit 5 is provided for each liquid processing unit 3 to switch and connect exhaust path 35 for discharging an exhaust gas of processing fluid from liquid processing units 3 to exclusive exhaust paths (connection flow paths) 61 to 63 corresponding to the kinds of the processing fluid and the flow path is switched by circumferentially rotating rotary tube 53, in flow path switching unit 5. Therefore, since switching to a plurality of flow paths 61 to 63 can be performed only by rotation driving unit 55 of rotary tube 53, the number of driving mechanisms for performing the switching operation is reduced. Accordingly, it is possible to decrease a time or an effort required for controlling the driving mechanisms, and to decrease the installation space as well.

Further, when flow path switching units 5 as described above are provided in liquid processing units 3, it is possible to switch and connected to exclusive exhaust paths corresponding to the kinds of processing fluid by rotating one rotary tube 53, when supplying a plurality of kinds of processing fluid to wafers W at different timing for the processing, even if the kinds of processing fluid increases. Accordingly, since the number of driving mechanisms decreases, it is possible to decrease a time or an effort required for controlling the driving mechanisms, and to decrease the installation space.

Further, in connection flow paths 61 to 63 of flow path forming member 6, it is possible to control the exhaust amount to be maintained at the same level in flow paths 61 to 63, regardless of whether exhaust is performed by liquid processing units 3, by controlling the opening degree of injection amount adjusting valves V11 to V13 provided for each of flow paths 61 to 63, as described above. Accordingly, it is possible to prevent changes in exhaust amount and non-uniformity in the processing states of the liquid processing units.

At this time, injection amount adjusting valves V11 to V13 may be provided for each of flow paths 61 to 63, even when air is sucked into and the exhaust amount is adjusted to be the same level in connection flow paths 61 to 63. Accordingly, even when a plurality of liquid processing units 3 are arranged, the total number of valves and the number of driving mechanisms are considerably reduced, as compared with the related art, without increasing the number of injection amount adjusting valves. Therefore, the number of components or driving mechanisms is reduced, the effort or time for control operations is reduced, and the space saving is achieved.

Further, pressure loss control valves V2 are provided at exhaust paths 35 of liquid processing units 3. Therefore, since each of liquid processing units 3 is connected at different positions of long exhaust paths 61 to 63, pressure loss in exhaust paths 35 of liquid processing units 3 are controlled to be uniform between liquid processing units 3 by controlling the opening degree of pressure loss control valve V2. Accordingly, the exhaust amount becomes constant between liquid processing units 3 and non-uniformity of liquid processing states can be prevented.

Figure 13:
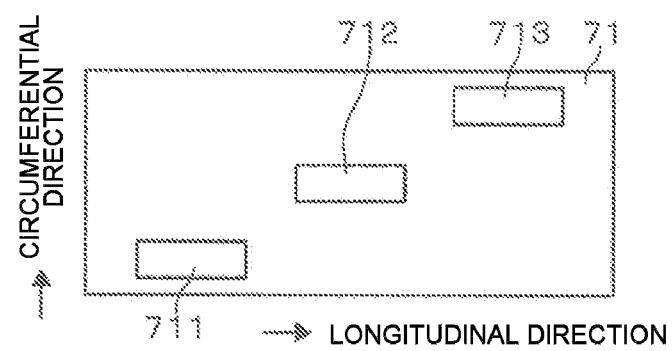
FIG. 13 is a developed view illustrating an outer tube and a rotary tube of another example of a flow path switching apparatus.
Figure 13:
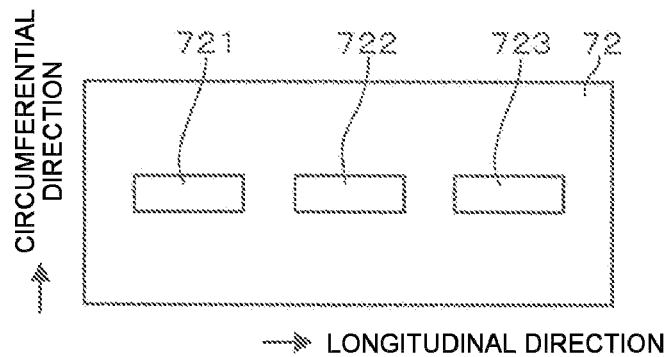

In the flow path switching apparatus of the present disclosure, for example, as shown in the developed view of outer tube 71 in FIG. 13A and the developed view of rotary tube 72 in FIG. 13B, a plurality of, for example, three connection holes 711 to 713 may be formed along the circumferential direction with predetermined intervals at outer tube 71 while a plurality of, for example, three openings 721 to 723 may be longitudinally formed in a line at rotary tube 72. Further, there may be several, for example, two or four or more connection holes and openings formed at the outer tube and at the rotary tube, respectively.

Figure 14:
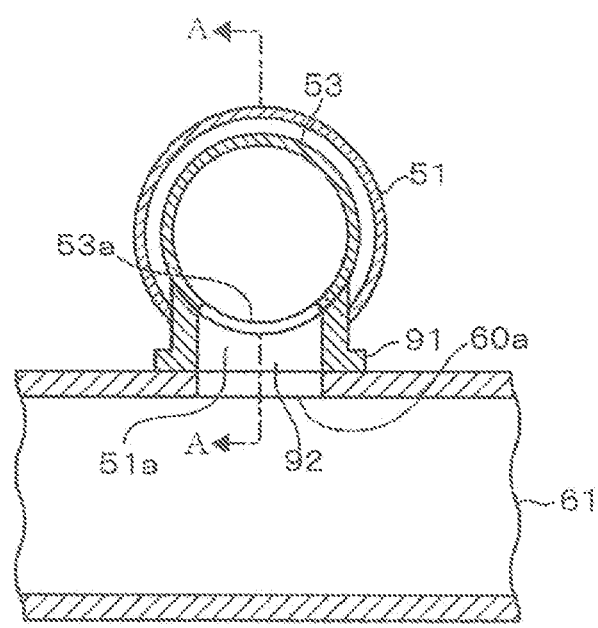
FIG. 14 is a cross-sectional view illustrating another example of a flow path switching apparatus.
Figure 14:
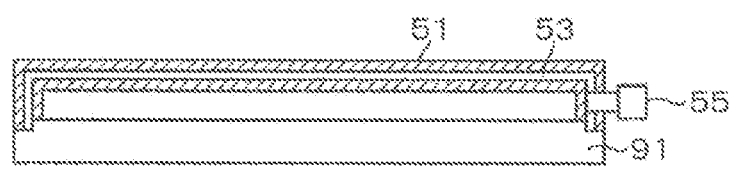

For example, as shown in FIG. 14, rotary tube 53 may be supported by a support member 91. FIG. 14B is a cross-sectional view taken along the line A-A in FIG. 14A. In this case, support member 91 is provided in the longitudinal direction of outer tube 51 and the top surface thereof is protruded into outer tube 51. And support member 91 is provided to support the outer areas of openings 53a to 53c of rotary tube 53 from the lower portion. Reference numeral 92 in the drawings represents an opening of support member 91. According to this configuration, since rotary tube 53 is supported by support member 91, rotary tube 53 is stably positioned in outer tube 51.

Figure 15:
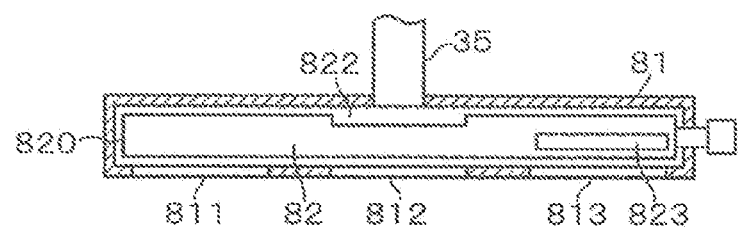
FIG. 15 is a cross-sectional view illustrating yet another example of a flow path switching apparatus.
Figure 16:
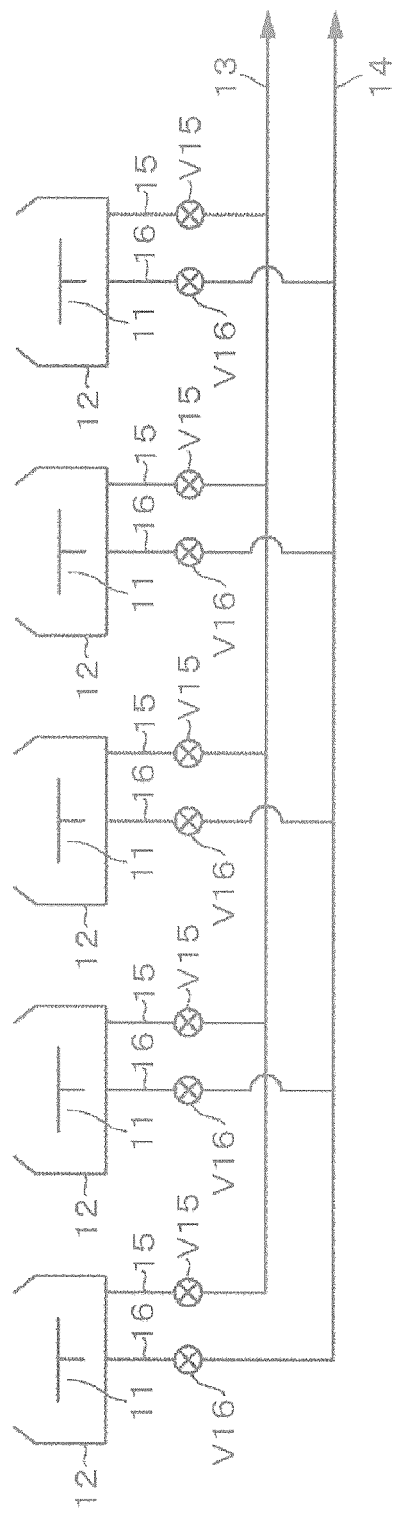
FIG. 16 is a cross-sectional view illustrating a liquid processing unit of the related art.

For example, as shown in FIG. 15, the other end 820 of rotary tube 82 is closed, and for example, exhaust path 35 (common path) may be connected at a position corresponding to the opening of rotary tube 82 in the longitudinal direction of outer tube 81. In the exemplary embodiment, exhaust path 35 is connected at the position corresponding to opening 822 formed at the center portion of rotary tube 82. In the exemplary embodiment, air flow is discharged from exhaust path 35 to a gap between outer tube 81 and rotary tube 82 and is supplied into rotary tube 82 through opening 822 and another opening 823 (one is not shown). When opening 822 is at a position where it rotates, it is opposite to exhaust path 35, such that opening 822 corresponds to a connection hole connected to common flow path 35. Further, the opening corresponding to the connection hole may be provided at a position where it does not interfere with switching the flow path, independently from openings 811, 812, and 813 for switching the flow path.

Further, the connection holes of the outer tube and the openings of the rotary tube may not be connected with the openings of the exclusive exhaust paths (connection flow paths) and all of openings 60a to 60c of the exclusive exhaust paths may be closed, in accordance with the rotational position of the rotary tube.

Further, the flow path switching apparatus and the flow path switching method of the present disclosure may be used either for a case where the common flow path is at the upstream of the connection flow path, or a case where the common flow path is at the downstream of the connection flow path. And the common flow path and the connection flow path may be flow paths for a gas or liquid. The processing apparatus and processing method of the present disclosure may be applied to any one of cases where the processing fluid is liquid and where it is a gas, and also may be applied to any one of cases where liquid is discharged and where a gas is discharged. Further, as in the exemplary embodiment described above, when the processing fluid is liquid and the atmosphere to which the processing fluid is supplied is discharged, an atmosphere to which the processing fluid was supplied and air flow containing the mists in the processing fluid are included in the atmosphere to which the fluid is supplied.

Further, the processing using the processing fluid is not limited to the liquid processing described above, and for example, it may be applied to a processing apparatus that hydrophobizes the surface of wafer W by supplying steam, such as HMDS (Hexamethyldisilazane), on wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a processing unit configured to perform a processing while supplying a plurality of processing fluids of different kinds to a subject at different timings;
    a common flow path provided in the processing unit and configured to discharge the plurality of processing fluids of different kinds supplied to the processing unit;
    a plurality of exclusive exhaust paths exclusively provided for each of the plurality of processing fluids of different kinds configured to discharge the processing fluids; and
    a flow path switching unit configured to switch and connect the common flow path to one of the plurality of exclusive exhaust paths corresponding to one of the plurality of processing fluids of different kinds,
    wherein the flow path switching unit comprising:
        an outer tube provided with a plurality of connection holes, each connection hole formed in the circumferential wall of the outer tube with a predetermined interval along the longitudinal direction of the outer tube and connected to a corresponding exclusive exhaust path;
        a rotary tube rotatably inserted into the outer tube with a rotating shaft provided alone the longitudinal direction of the outer tube and provided with a plurality of openings, each opening formed in the circumferential wall of the rotary tube with a predetermined interval at a corresponding position to the connection holes of the outer tube along the longitudinal direction of the rotary tube and the rotating shaft, and connected to the common flow path; and
        a rotation driving unit configured to rotate the rotary tube, wherein only one of the plurality of openings of the rotary tube is aligned with only one of the plurality of connection holes of the outer tube during the rotation of the rotary tube, and only an aligned set of an opening of the rotary tube and a connection hole of the outer tube is sequentially communicated during the rotation of the rotary tube.

2. The substrate processing apparatus of claim 1, wherein the plurality of connection holes of the outer tube are formed in a line in the longitudinal direction of the outer tube.

3. The substrate processing apparatus of claim 1, wherein the processing apparatus comprises a plurality of processing units, and a plurality of flow path switching units each corresponding to the common flow path provided in the plurality of processing units.

4. The substrate processing apparatus of claim 3, further comprising:
    a plurality of fluid intake openings respectively provided in the plurality of exclusive exhaust paths;
    a plurality of fluid intake amount control valves respectively provided at the plurality of fluid intake openings and configured to control the opening degree of the fluid intake openings controlling the intake amount of fluid; and
    a control unit configured to control the opening degree of the fluid intake amount control valves on the basis of the flow rate of the processing fluid flowing through the exclusive exhaust paths.

5. The substrate processing apparatus of claim 3, wherein a plurality of pressure loss control valves are respectively provided in the common flow paths to control the opening degree of the common flow path in order to control a pressure loss in the respective common flow paths.

6. The substrate processing apparatus of claim 1, wherein the plurality of exclusive exhaust paths are arranged horizontally in parallel with each other,
    the outer tube is provided to be perpendicular to the longitudinal direction of the plurality of exclusive exhaust paths, and
    an opening is formed at a region where the outer tube is disposed in each of the plurality of exclusive exhaust paths such that the outer tube and the plurality of exclusive exhaust paths are communicated with each other through the openings in the plurality of exclusive exhaust paths and the connection holes in the outer tube.

* * * * *